(12) United States Patent
Vonderhaar et al.

(10) Patent No.: US 8,754,653 B2
(45) Date of Patent: *Jun. 17, 2014

(54) ELECTRONIC BATTERY TESTER

(75) Inventors: J. David Vonderhaar, Bolingbrook, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/498,642

(22) Filed: Jul. 7, 2009

(65) Prior Publication Data

US 2010/0013489 A1    Jan. 21, 2010

Related U.S. Application Data

(62) Division of application No. 10/441,271, filed on May 19, 2003, now Pat. No. 7,557,586, which is a division of application No. 09/703,270, filed on Oct. 31, 2000, now Pat. No. 6,566,883.

(60) Provisional application No. 60/163,013, filed on Nov. 1, 1999.

(51) Int. Cl.
    *G01N 27/416*    (2006.01)
(52) U.S. Cl.
    USPC ........................... 324/426; 320/118
(58) Field of Classification Search
    USPC ............................ 324/426; 320/119, 124, 128
    See application file for complete search history.

(56) References Cited

U.S. PATENT DOCUMENTS

| 85,553 | A | 1/1869 | Adams | 33/472 |
|---|---|---|---|---|
| 2,000,665 | A | 5/1935 | Neal | 439/440 |
| 2,417,940 | A | 3/1947 | Lehman | 200/61.25 |
| 2,437,772 | A | 3/1948 | Wall | 324/523 |
| 2,514,745 | A | 7/1950 | Dalzell | 324/115 |
| 2,727,221 | A | 12/1955 | Springg | 340/447 |
| 3,178,686 | A | 4/1965 | Mills | 340/447 |
| 3,223,969 | A | 12/1965 | Alexander | 340/447 |
| 3,267,452 | A | 8/1966 | Wolf | 340/249 |
| 3,356,936 | A | 12/1967 | Smith | 324/429 |
| 3,562,634 | A | 2/1971 | Latner | 324/427 |
| 3,593,099 | A | 7/1971 | Scholl | 320/127 |
| 3,607,673 | A | 9/1971 | Seyl | 324/425 |
| 3,652,341 | A | 3/1972 | Halsall et al. | 29/623.2 |

(Continued)

FOREIGN PATENT DOCUMENTS

DE    29 26 716 B1    1/1981
DE    196 38 324       9/1996

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Yalkew Fantu

(74) *Attorney, Agent, or Firm* — Westman, Champlin & Koehler, P.A.

(57) ABSTRACT

An electronic battery tester for testing a storage battery includes test circuitry configured to provide an output based upon a selected test criteria. Additionally, circuitry is provided to assist in balancing batteries used in a string of multiple batteries.

9 Claims, 3 Drawing Sheets

(56) References Cited

U.S. PATENT DOCUMENTS

| | | | |
|---|---|---|---|
| 3,676,770 A | 7/1972 | Sharaf et al. | 324/430 |
| 3,699,433 A | 10/1972 | Smith, Jr. | 324/523 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,857,082 A | 12/1974 | Van Opijnen | 320/143 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,920,284 A | 11/1975 | Lane et al. | 303/122.06 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A * | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,610 A | 6/1980 | Gordon | 701/33.9 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| D299,909 S | 2/1989 | Casey | D10/77 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| D330,338 S | 10/1992 | Wang | D10/77 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,187,382 A | 2/1993 | Kondo | |
| 5,194,799 A | 3/1993 | Tomantschger | 320/103 |
| 5,204,611 A | 4/1993 | Nor et al. | 320/145 |

(56) References Cited

U.S. PATENT DOCUMENTS

| | | | |
|---|---|---|---|
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,332,927 A | 7/1994 | Paul et al. | 307/66 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,387,871 A | 2/1995 | Tsai | 324/429 |
| 5,394,093 A | 2/1995 | Cervas | 324/556 |
| 5,402,007 A | 3/1995 | Center et al. | 290/40 B |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,425,041 A | 6/1995 | Seko et al. | 372/45.01 |
| 5,426,371 A | 6/1995 | Salley et al. | 324/429 |
| 5,426,416 A | 6/1995 | Jefferies et al. | 340/664 |
| 5,430,645 A | 7/1995 | Keller | 364/424.01 |
| 5,432,025 A | 7/1995 | Cox | 29/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,459,660 A | 10/1995 | Berra | 701/33 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,504,674 A | 4/1996 | Chen et al. | 705/4 |
| 5,508,599 A | 4/1996 | Koenck | 320/138 |
| 5,519,383 A | 5/1996 | De La Rosa | 340/636.15 |
| 5,528,148 A | 6/1996 | Rogers | 320/1.37 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,573,611 A | 11/1996 | Koch et al. | 152/152.1 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,416 A | 12/1996 | Audett et al. | 522/35 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,596,261 A | 1/1997 | Suyama | 320/152 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,631,536 A | 5/1997 | Tseng | 320/15 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,644,212 A | 7/1997 | Takahashi | |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,666,040 A | 9/1997 | Bourbeau | 320/118 |
| 5,675,234 A | 10/1997 | Greene | 340/636.11 |
| 5,677,077 A | 10/1997 | Faulk | 429/90 |
| 5,684,678 A | 11/1997 | Barrett | 363/17 |
| 5,691,621 A | 11/1997 | Phuoc et al. | 320/134 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,712,795 A | 1/1998 | Layman et al. | 700/297 |
| 5,717,336 A | 2/1998 | Basell et al. | 324/430 |
| 5,717,937 A | 2/1998 | Fritz | 713/300 |
| 5,721,688 A | 2/1998 | Bramwell | 324/426 |
| 5,732,074 A | 3/1998 | Spaur et al. | 370/313 |
| 5,739,667 A | 4/1998 | Matsuda et al. | 320/128 |
| 5,744,962 A * | 4/1998 | Alber et al. | 324/426 |
| 5,745,044 A | 4/1998 | Hyatt, Jr. et al. | 340/5.23 |
| 5,747,189 A * | 5/1998 | Perkins | 429/91 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,962 A | 6/1998 | Nor | 20/134 |
| 5,773,978 A | 6/1998 | Becker | 324/430 |
| 5,778,326 A | 7/1998 | Moroto et al. | 701/22 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,201 A * | 10/1998 | Stockstad et al. | 320/119 |
| 5,818,234 A | 10/1998 | McKinnon | 324/433 |
| 5,820,407 A | 10/1998 | Morse et al. | 439/504 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,832,396 A | 11/1998 | Moroto et al. | 701/22 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,869,951 A | 2/1999 | Takahashi | 320/104 |
| 5,871,858 A | 2/1999 | Thomsen et al. | 429/7 |
| 5,872,443 A | 2/1999 | Williamson | 320/160 |
| 5,872,453 A | 2/1999 | Shimoyama et al. | 324/431 |
| 5,883,306 A | 3/1999 | Hwang | 73/146.8 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |

(56) References Cited

U.S. PATENT DOCUMENTS

| | | | |
|---|---|---|---|
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,946,605 A | 8/1999 | Takahisa et al. | 455/68 |
| 5,950,144 A | 9/1999 | Hall et al. | 702/108 |
| 5,951,229 A | 9/1999 | Hammerslag | 414/398 |
| 5,953,322 A | 9/1999 | Kimball | 370/328 |
| 5,955,951 A | 9/1999 | Wischerop et al. | 340/572.8 |
| 5,961,561 A | 10/1999 | Wakefield, II | 701/29 |
| 5,961,604 A | 10/1999 | Anderson et al. | 709/229 |
| 5,963,012 A | 10/1999 | Garcia et al. | 320/106 |
| 5,969,625 A | 10/1999 | Russo | 340/636.19 |
| 5,973,598 A | 10/1999 | Beigel | 340/572.1 |
| 5,978,805 A | 11/1999 | Carson | 707/10 |
| 5,982,138 A | 11/1999 | Krieger | 320/105 |
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,121,880 A | 9/2000 | Scott et al. | 340/572.5 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,202,739 B1 | 3/2001 | Pal et al. | 165/104.33 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,262,692 B1 | 7/2001 | Babb | 343/895 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/400 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,448,778 B1 | 9/2002 | Rankin | 324/503 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,648 B1 | 3/2003 | Chitsazan et al. | 320/153 |
| 6,532,425 B1 | 3/2003 | Boost et al. | 702/63 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |

(56) References Cited

U.S. PATENT DOCUMENTS

| | | | |
|---|---|---|---|
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/31 |
| 6,745,153 B2 | 6/2004 | White et al. | 702/184 |
| 6,759,849 B2 | 7/2004 | Bertness | 324/426 |
| 6,771,073 B2 | 8/2004 | Henningson et al. | 324/426 |
| 6,777,945 B2 | 8/2004 | Roberts et al. | 324/426 |
| 6,781,344 B1 | 8/2004 | Hedegor et al. | 320/106 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,162 B1 | 2/2005 | Greatorex et al. | 324/764.01 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,983,212 B2 | 1/2006 | Burns | 702/63 |
| 6,993,421 B2 | 1/2006 | Pillar et al. | 701/29.4 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2* | 3/2006 | Smith et al. | 324/426 |
| 7,015,674 B2 | 3/2006 | VonderHaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,042,346 B2 | 5/2006 | Paulsen | 340/438 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,170,393 B2 | 1/2007 | Martin | 340/10.1 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,202,636 B2 | 4/2007 | Reynolds et al. | 320/166 |
| 7,208,914 B2 | 4/2007 | Klang | 320/132 |
| 7,209,850 B2 | 4/2007 | Brott et al. | 324/426 |
| 7,209,860 B2 | 4/2007 | Trsar et al. | 702/183 |
| 7,212,887 B2 | 5/2007 | Shah et al. | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Mellchar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,590,476 B2 | 9/2009 | Shumate | 701/31.6 |
| 7,592,776 B2 | 9/2009 | Tsukamoto et al. | 320/136 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,667,437 B2 | 2/2010 | Johnson et al. | 320/150 |
| 7,679,325 B2 | 3/2010 | Seo | 20/116 |
| 7,684,908 B1 | 3/2010 | Ogilvie et al. | 701/29.6 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,556 B2 | 6/2010 | Yano et al. | 320/134 |
| 7,728,597 B2 | 6/2010 | Bertness | 324/426 |
| 7,751,953 B2 | 7/2010 | Namaky | 701/33.2 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,848,857 B2 | 12/2010 | Nasr et al. | 701/22 |
| 7,883,002 B2 | 2/2011 | Jin et al. | 235/376 |
| 7,902,990 B2 | 3/2011 | Delmonico et al. | 340/636.1 |
| 7,924,015 B2 | 4/2011 | Bertness | 324/427 |
| 7,940,053 B2 | 5/2011 | Brown et al. | 324/426 |
| 7,999,505 B2 | 8/2011 | Bertness | 320/104 |

(56) References Cited

U.S. PATENT DOCUMENTS

| | | | |
|---|---|---|---|
| 8,164,343 B2 | 4/2012 | Bertness | 324/503 |
| 2001/0035737 A1 | 11/2001 | Nakanishi et al. | 320/122 |
| 2002/0004694 A1 | 1/2002 | McLeod | 701/29 |
| 2002/0010558 A1 | 1/2002 | Bertness et al. | 702/63 |
| 2002/0021135 A1 | 2/2002 | Li | 24/677 |
| 2002/0030495 A1 | 3/2002 | Kechmire | 324/427 |
| 2002/0041175 A1 | 4/2002 | Lauper et al. | 320/106 |
| 2002/0044050 A1 | 4/2002 | Derbyshire et al. | 340/442 |
| 2002/0050163 A1 | 5/2002 | Makhija et al. | 73/116 |
| 2002/0074398 A1 | 6/2002 | Lancos et al. | 235/382 |
| 2002/0118111 A1 | 8/2002 | Brown et al. | 340/573.1 |
| 2002/0121901 A1 | 9/2002 | Hoffman | 324/426 |
| 2002/0171428 A1 | 11/2002 | Bertness | 702/63 |
| 2002/0176010 A1 | 11/2002 | Wallach et al. | 348/362 |
| 2003/0006779 A1 | 1/2003 | Youval | 324/503 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0078743 A1 | 4/2003 | Bertness et al. | 702/63 |
| 2003/0088375 A1 | 5/2003 | Bertness et al. | 702/63 |
| 2003/0124417 A1 | 7/2003 | Bertness et al. | 429/90 |
| 2003/0128036 A1 | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0051534 A1 | 3/2004 | Kobayashi et al. | 324/429 |
| 2004/0054503 A1 | 3/2004 | Namaky | 702/183 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |
| 2004/0178185 A1 | 9/2004 | Yoshikawa et al. | 219/270 |
| 2004/0199343 A1 | 10/2004 | Cardinal et al. | 702/63 |
| 2004/0207367 A1 | 10/2004 | Taniguchi et al. | 320/149 |
| 2004/0227523 A1 | 11/2004 | Namaky | 324/537 |
| 2004/0239332 A1 | 12/2004 | Mackel et al. | 324/426 |
| 2004/0251876 A1 | 12/2004 | Bertness et al. | 320/136 |
| 2005/0007068 A1 | 1/2005 | Johnson et al. | 320/110 |
| 2005/0017726 A1 | 1/2005 | Koran et al. | 324/433 |
| 2005/0021294 A1 | 1/2005 | Trsar et al. | 702/183 |
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0073314 A1 | 4/2005 | Bertness et al. | 324/433 |
| 2005/0076107 A1 | 4/2005 | Gross | 725/107 |
| 2005/0102073 A1 | 5/2005 | Ingram | 701/29 |
| 2005/0128083 A1 | 6/2005 | Puzio et al. | 340/572.1 |
| 2005/0159847 A1 | 7/2005 | Shah et al. | 700/276 |
| 2005/0162172 A1 | 7/2005 | Bertness | 324/426 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0218902 A1 | 10/2005 | Restaino et al. | 324/433 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2006/0012330 A1 | 1/2006 | Okumura et al. | 320/103 |
| 2006/0030980 A1 | 2/2006 | St. Denis | 701/29 |
| 2006/0089767 A1 | 4/2006 | Sowa | 701/29 |
| 2006/0095230 A1 | 5/2006 | Grier et al. | 702/183 |
| 2006/0161313 A1 | 7/2006 | Rogers et al. | 701/1 |
| 2006/0161390 A1 | 7/2006 | Namaky et al. | 702/183 |
| 2006/0217914 A1 | 9/2006 | Bertness | 702/113 |
| 2006/0282323 A1 | 12/2006 | Walker et al. | 705/14 |
| 2007/0024460 A1 | 2/2007 | Clark | 340/663 |
| 2007/0026916 A1 | 2/2007 | Juds et al. | 463/1 |
| 2007/0046261 A1 | 3/2007 | Porebski | 320/132 |
| 2007/0159177 A1 | 7/2007 | Bertness et al. | 324/426 |
| 2007/0194791 A1 | 8/2007 | Huang | 324/430 |
| 2007/0194793 A1 | 8/2007 | Bertness | 324/503 |
| 2007/0259256 A1 | 11/2007 | Le Canut et al. | 429/90 |
| 2008/0036421 A1 | 2/2008 | Seo et al. | 320/132 |
| 2008/0059014 A1 | 3/2008 | Nasr et al. | 701/22 |
| 2008/0094068 A1 | 4/2008 | Scott | 324/426 |
| 2008/0169818 A1 | 7/2008 | Lesesky et al. | 324/426 |
| 2008/0303528 A1 | 12/2008 | Kim | 324/430 |
| 2008/0303529 A1 | 12/2008 | Nakamura et al. | 324/433 |
| 2009/0006476 A1 | 1/2009 | Andreasen et al. | 707/104.1 |
| 2009/0146800 A1 | 6/2009 | Grimlund et al. | 340/505 |
| 2009/0198372 A1 | 8/2009 | Hammerslag | 700/226 |
| 2009/0247020 A1 | 10/2009 | Gathman et al. | 439/759 |
| 2009/0276115 A1 | 11/2009 | Chen | 701/32 |
| 2010/0145780 A1 | 6/2010 | Nishikawa et al. | 705/14.11 |
| 2010/0314950 A1 | 12/2010 | Rutkowski et al. | 307/125 |
| 2011/0004427 A1 | 1/2011 | Gorbold et al. | 702/63 |

FOREIGN PATENT DOCUMENTS

| | | |
|---|---|---|
| DE | 10 2008 036 5 | 2/2010 |
| EP | 0 022 450 A1 | 1/1981 |
| EP | 0 476 405 A1 | 9/1991 |
| EP | 0 637 754 A1 | 2/1995 |
| EP | 0 772 056 A1 | 5/1997 |
| EP | 0 902 521 A2 | 3/1999 |
| EP | 0 982 159 A2 | 3/2000 |
| EP | 1 810 869 A1 | 11/2004 |
| EP | 1 807 710 B1 | 7/2007 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/21132 | 5/1998 |
| WO | WO 98/58270 | 12/1998 |

(56) References Cited

FOREIGN PATENT DOCUMENTS

| WO | WO 99/23738 | 5/1999 |
|---|---|---|
| WO | WO 99/56121 | 11/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113. 006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Mar. 1969, Linear Brief 5.
Burr-Brown Corporation, "Design a 60 Hz Notch Filter with the UAF42", Jan. 1994, AB-071, 1994.
National Semiconductor Corporation, "LMF90-4$^{th}$-Order Elliptic Notch Filter", Dec. 1994, RRD-B30M115.
"Alligator Clips with Wire Penetrators" *J.S. Popper, Inc.* product information, downloaded from http://www.jspopper.com/, prior to Oct. 1, 2002.
"#12: LM78S40 Simple Switcher DC to DC Converter", *ITM e-Catalog*, downloaded from http://www.pcbcafe.com, prior to Oct. 1, 2002.
"Simple DC-DC Converts Allows Use of Single Battery", *Electronix Express*, downloaded from http://www.elexp.com/t_dc-dc.htm, prior to Oct. 1, 2002.
"DC-DC Converter Basics", *Power Designers*, downloaded from http://www.powederdesigners.com/InforWeb.design_center/articles/DC-DC/converter.shtm, prior to Oct. 1, 2002.
Notification of Transmittal of the International Search Report or the Declaration, PCT/US02/29461.
Notification of Transmittal of the International Search Report or the Declaration, PCT/US03/07546.
Notification of Transmittal of the International Search Report or the Declaration, PCT/US03/06577.
Notification of Transmittal of the International Search Report or the Declaration, PCT/US03/07837.
"Improved Impedance Spectroscopy Technique for Status Determination of Production Li/SO$_2$ Batteries" Terrill Atwater et al., pp. 10-113, (1992).
Notification of Transmittal of the International Search Report or the Declaration, PCT/US03/41561.
Notification of Transmittal of the International Search Report or the Declaration, PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2; Sep. 7, 2004.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
Search Report Under Section 17 for Great Britain Application No. GB0421447.4.
"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.
Examination Report from the UK Patent Office for App. No. 0417678.0; Jan. 24, 2005.
Wikipedia Online Encyclopedia, Inductance, 2005, http://en. wikipedia.org/wiki/inductance, pp. 1-5, mutual Inductance, pp. 3,4.
"Professional BCS System Analyzer Battery-Charger-Starting", pp. 2-8, (2001).
Young Illustrated Encyclopedia Dictionary of Electronics, 1981, Parker Publishing Company, Inc., pp. 318-319.
Office Action from U.S. Appl. No. 11/352,945; dated Jan. 5, 2007.
Office Action from U.S. Appl. No. 11/146,608 dated May 13, 2008.
Office Action from U.S. Appl. No. 11/063,247 dated Apr. 11, 2008.
"DSP Applications in Hybrid Electric Vehicle Powertrain", Miller et al., Proceedings of the American Control Conference, Sand Diego, CA, Jun. 1999; 2 ppg.
Notification of Transmittal of the International Search Report and the Written Opinion of the International Searching Authority, or the Declaration for PCT/US2008/008702 filed Jul. 2008; 15 pages.
Notification Concerning Availability of the Publication of the International Application for PCT/US2008/008702, filed Jul. 17, 2008; 24 pages.
First Notice Informing the Applicant of the Communication of the International Application (to Designated Offices which do not apply the 30 Month Time Limit Under Article 22(1)) for PCT/US2008/008702 filed Jul. 17, 2008; one page.
Notification of the Recording of a Change for PCT/US2008/008702 filed Jul. 17, 2008; one page.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).

(56) References Cited

OTHER PUBLICATIONS

"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).
"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).
"Testing 24 Volt Aircraft Batteries Using Midtronics Conductance Technology", by M. Hlavac et al., Jan. 1995, 9 pgs; (13 total pgs.).
"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).
"VRLA Battery Conductance Monitoring Part V: Strategies for VRLA Battery Testing and Monitoring in Telecom Operating Environments", by M. Hlavac et al., Oct. 1996, 9 pgs; (13 total pgs.).
"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).
"Impedance/Conductance Measurements as an Aid to Determining Replacement Strategies", M. Kniveton, Sep. 1998, pp. 297-301; (9 total pgs.).
"A Fundamentally New Approach to Battery Performance Analysis Using DFRA™/DTIS™ Technology", by K. Champlin et al., Sep. 2000, 8 pgs; (12 total pgs.).
"Battery State of Health Monitoring, Combining Conductance Technology With Other Measurement Parameters for Real-Time Battery Performance Analysis", by D. Cox et la., Mar. 2000, 6 pgs; (10 total pgs.).
Search Report and Written Opinion from PCT Application No. PCT/US2011/026608, dated Aug. 29, 2011, 9 pgs.
Examination Report under section 18(3) for corresponding Great Britain Application No. GB1000773.0, dated Feb. 6, 2012, 2 pages.
Communication from GB1216105.5, dated Sep. 21, 2012.
Notification of Transmittal of the International Search Report and Written Opinion from PCT/US2011/039043, dated Jul. 26, 2012.
Notification of Transmittal of the International Search Report and Written Opinion from PCT/US2011/053886, dated Jul. 27, 2012.
"A Microprocessor-Based Control System for a Near-Term Electric Vehicle", Bimal K. Bose; IEEE Transactions on Industry Applications, vol. IA-17, No. 6, Nov./Dec. 1981; 0093-9994/81/1100-0626$00.75 © 1981 IEEE, 6 pages.
U.S. Appl. No. 60/387,912, filed Jun. 13, 2002 which is related to U.S. Patent No. 7,089,127.
"Field Evaluation of Honda's EV PLUS Battery Packs", by A. Paryani, *IEEE AES Systems Magazine*, Nov. 2000, pp. 21-24.
Search Report from PCT/US2011/047354, dated Nov. 11, 2011.
Written Opinion from PCT/US2011/047354, dated Nov. 11, 2011.
Office Action from U.S. Appl. No. 13/048,365, dated Oct. 3, 2013.
USPTO Office Action from related U.S. Appl. No. 10/441,271, mail date Feb. 12, 2007.
USPTO Office Action from related U.S. Appl. No. 10/441,271, mail date Dec. 6, 2007.
USPTO Office Action from related U.S. Appl. No. 10/441,271, mail date Jun. 16, 2008.
USPTO Office Action from related U.S. Appl. No. 10/441,271, mail date Oct. 29, 2008.
USPTO Office Action from related U.S. Appl. No. 10/441,271, mail date Sep. 1, 2006.
USPTO Office Action from related U.S. Appl. No. 10/441,271, mail date Feb. 16, 2006.
USPTO Office Action from related U.S. Appl. No. 10/441,271, mail date Oct. 5, 2005.
USPTO Office Action from related U.S. Appl. No. 10/441,271, mail date Aug. 30, 2004.
USPTO Office Action from related U.S. Appl. No. 10/441,271, mail date Apr. 22, 2004.
USPTO Office Action from related U.S. Appl. No. 09/703,270, mail date Jan. 30, 2002.
Office Action for corresponding U.S. Appl. No. 12/698,375, dated Jun. 23, 2010, 9 pages.
Office Action for corresponding U.S. Appl. No. 12/498,642, dated Mar. 4, 2010, 8 pages.
Office Action for corresponding U.S. Appl. No. 12/498,642, dated Jun. 9, 2010, 10 pages.
Office Action for corresponding U.S. Appl. No. 12/498,642, dated Sep. 29, 2010, 11 pages.
Office Action for corresponding U.S. Appl. No. 12/498,642, dated Mar. 21, 2011, 10 pages.
Office Action for corresponding U.S. Appl. No. 12/498,642, dated Aug. 18, 2011, 11 pages.
Office Action for corresponding U.S. Appl. No. 10/896,834, dated Oct. 18, 2007, 5 pages.
Office Action for corresponding U.S. Appl. No. 10/896,834, dated Apr. 18, 2008, 4 pages.
Office Action for corresponding U.S. Appl. No. 10/791,141, dated Dec. 21, 2006, 18 pages.
Office Action for corresponding U.S. Appl. No. 10/791,141, dated Jul. 27, 2007, 17 pages.
Office Action for corresponding U.S. Appl. No. 10/791,141, dated Dec. 17, 2007, 15 pages.
Office Action for corresponding U.S. Appl. No. 10/791,141, dated Jun. 23, 2008, 18 pages.
Office Action for corresponding U.S. Appl. No. 10/791,141, dated Sep. 30, 2008, 16 pages.
Office Action for corresponding U.S. Appl. No. 10/791,141, dated Apr. 2, 2009, 16 pages.
Office Action for corresponding U.S. Appl. No. 10/791,141, dated Jul. 9, 2009, 15 pages.
Office Action for corresponding U.S. Appl. No. 10/791,141, dated Jan. 20, 2010, 16 pages.
Office Action for corresponding U.S. Appl. No. 10/791,141, dated Jun. 8, 2010, 16 pages.
Office Action for corresponding U.S. Appl. No. 10/791,141, dated Oct. 13, 2010, 13 pages.
Office Action for corresponding U.S. Appl. No. 10/791,141, dated Mar. 1, 2011, 13 pages.
Office Action for corresponding U.S. Appl. No. 10/791,141, dated Jun. 22, 2011, 13 pages.
Office Action for corresponding U.S. Appl. No. 10/791,141, dated Oct. 5, 2011, 13 pages.
Office Action for corresponding U.S. Appl. No. 10/098,741, dated Sep. 17, 2003, 6 pages.
Office Action for corresponding U.S. Appl. No. 10/098,741, dated Jan. 14, 2004, 7 pages.
Office Action for corresponding U.S. Appl. No. 10/098,741, dated Jun. 3, 2004, 6 pages.
Office Action for corresponding U.S. Appl. No. 10/046,659, dated Jun. 18, 2003, 9 pages.
Office Action for corresponding U.S. Appl. No. 09/703,270, dated Jan. 30, 2002, 7 pages.
Office Action for corresponding U.S. Appl. No. 09/564,740, dated Mar. 28, 2001, 8 pages.
Office Action for corresponding U.S. Appl. No. 09/293,020, dated Dec. 20, 2000, 11 pages.

(56) References Cited

OTHER PUBLICATIONS

Office Action for corresponding U.S. Appl. No. 08/681,730, dated Oct. 24, 2007, 4 pages.
Office Action for corresponding U.S. Appl. No. 08/681,730, dated Apr. 24, 1997, 6 pages.
Office Action for corresponding U.S. Appl. No. 08/681,730, dated May 11, 1998, 4 pages.
Search Report and Written Opinion from PCT Application No. PCT/US2011/038279, dated Sep. 16, 2011, 12 pgs.

\* cited by examiner

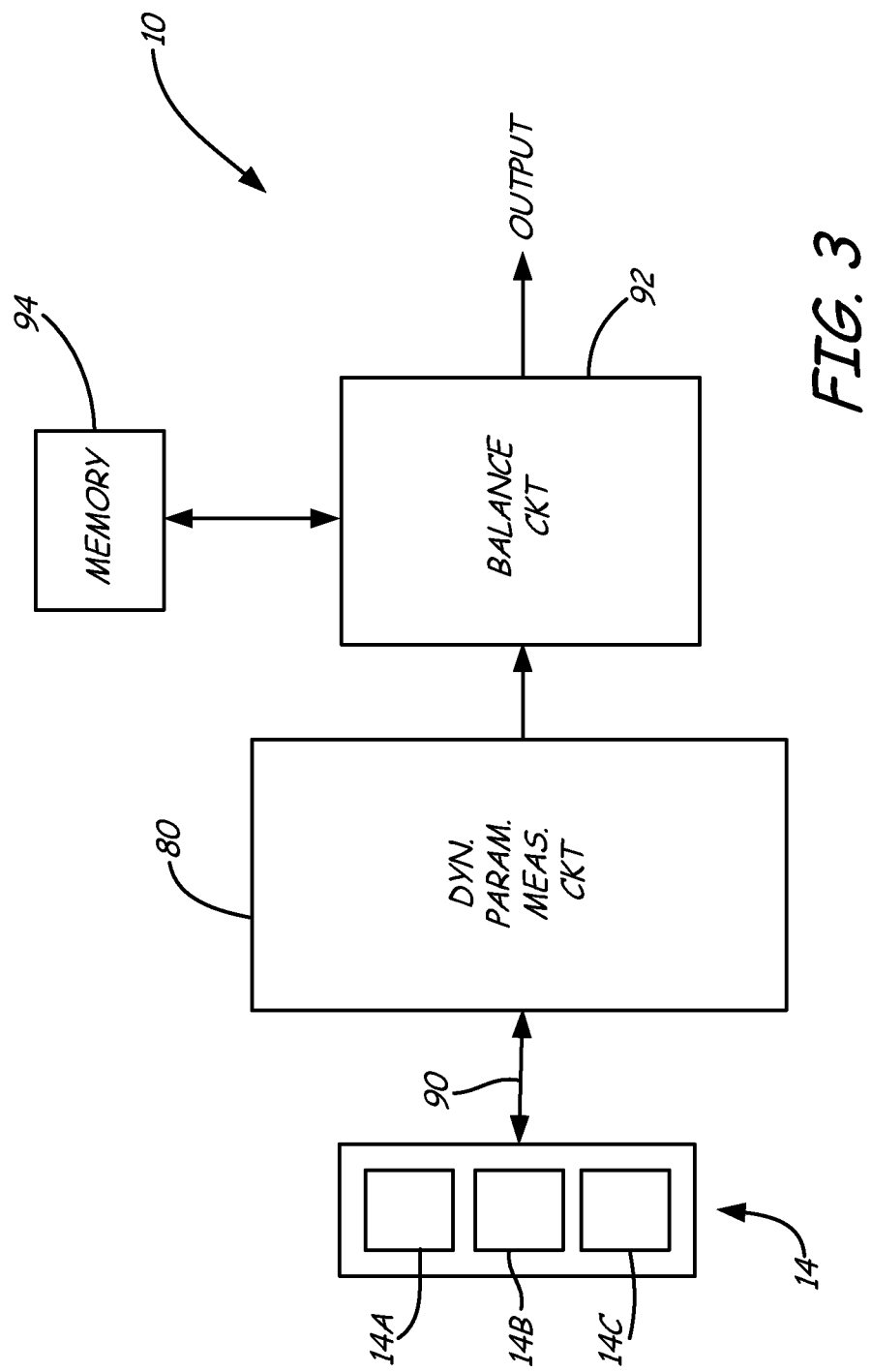

ELECTRONIC BATTERY TESTER

The present invention is a Divisional of U.S. application Ser. No. 10/441,271, filed May 19, 2003, which is a Divisional of U.S. application Ser. No. 09/703,270, filed Oct. 31, 2000, now U.S. Pat. No. 6,566,883, which claims priority to Provisional Application Ser. No. 60/163,013, filed Nov. 1, 1999 and entitled AUTOMOTIVE BATTERY CHARGING SYSTEM TESTER.

BACKGROUND OF THE INVENTION

The present invention relates to storage batteries. More specifically, the present invention relates to a battery system tester for testing storage batteries.

Many attempts have been made to test storage batteries. One technique which has been pioneered by Dr. Keith S. Champlin and Midtronics, Inc. of Burr Ridge, Ill. relates to measuring the conductance of batteries to determine their condition. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; and U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY.

With the advent of accurate battery testing, it has become apparent that in some instances the battery testing technique may not be appropriate for the particular purpose of the battery or configuration of multiple batteries.

SUMMARY OF THE INVENTION

An electronic battery tester for testing a storage battery, includes a dynamic measurement circuit configured to measure at least one dynamic parameter of the battery. A memory is configured to store a plurality of test criteria and an input is configured to receive input data related to a selected test criteria. A test circuit provides an output related to battery condition as a function of the dynamic parameter an the selected test criteria. In another aspect, a memory is configured to store a first dynamic parameter from the measurement circuitry related to a first battery of a battery pack. Balance circuitry provides an in-balance output if a second battery in the pack has a dynamic parameter which is substantially equal to the first dynamic parameter.

BRIEF DESCRIPTION OF THE DRAWINGS

FIG. 3 is a simplified diagram illustrating a tester in accordance with the present invention.

DETAILED DESCRIPTION OF THE PREFERRED EMBODIMENTS

Figure 1:
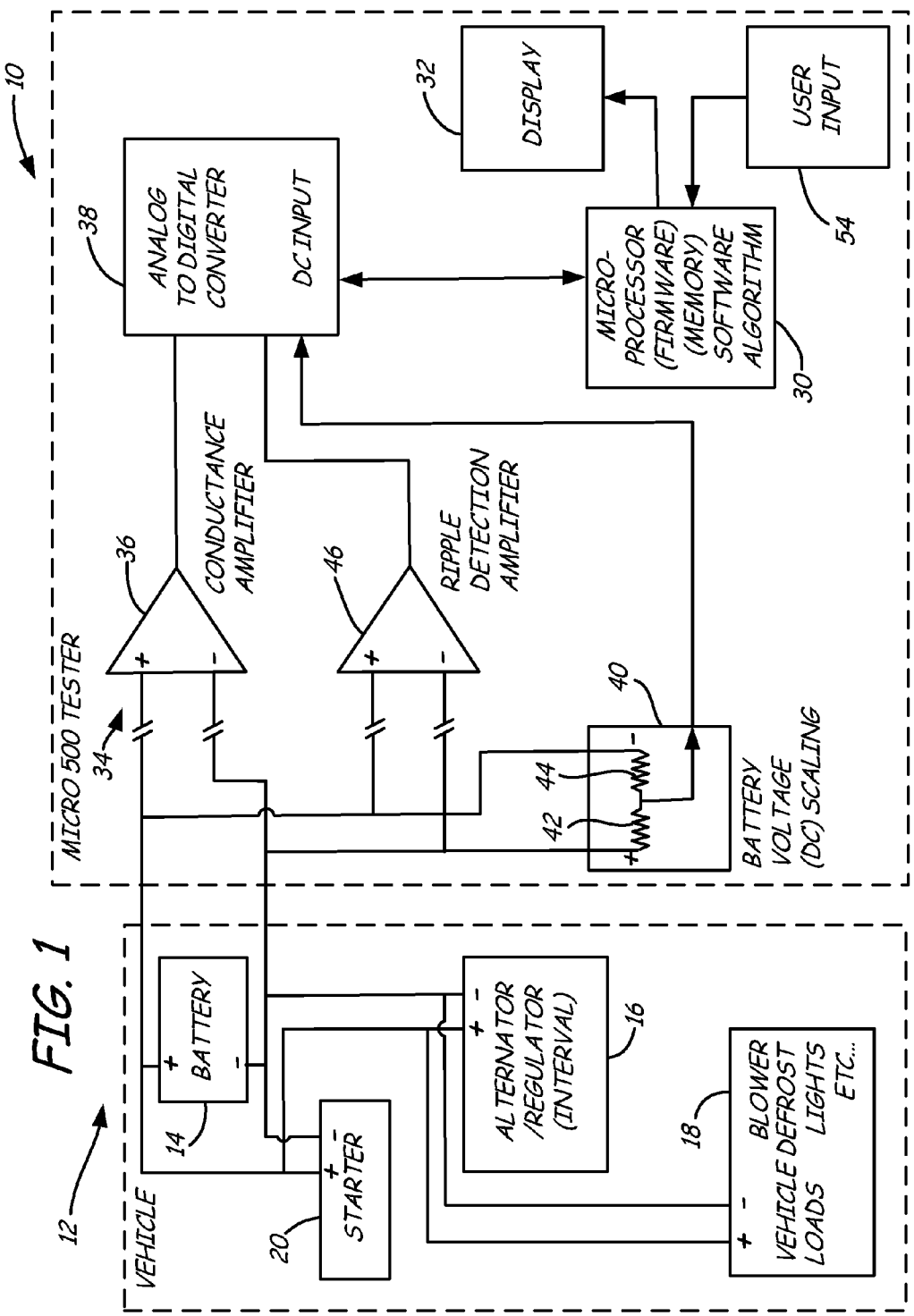
FIG. 1 is a simplified block diagram of a battery tester in accordance with the present invention.

FIG. 1 is a simplified block diagram of a battery tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 36. Section 34 operates in accordance with, for example, the conductance based battery testing techniques described in Champlin U.S. Pat. No. 3,873,911, issued Mar. 25, 1975; to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,598,098, issued Jan. 28, 1997, entitled ELECTRONIC BATTERY TESTER WITH VERY HIGH NOISE IMMUNITY; U.S. Pat. No. 5,821,756, issued Oct. 13, 1998, entitled ELECTRONIC BATTERY TESTER WITH TAILORED COMPENSATION FOR LOW STATE-OF-CHARGE. Section 34 is illustrated in very simplified form and conductance amplifier 36 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

In another aspect of the present invention, microprocessor 30 includes a memory which is capable of storing a number of different decision making algorithms or test criteria. The particular test criteria or algorithm can be selected through user input 54. For example, in one aspect, the test criteria is selected based upon the particular type of battery or rated reserve capacity of the battery. For example, if a battery is rated as having a particularly robust design with a large reserve capacity, the test criteria can be made more stringent such that an indication that the battery is "good" is only provided if the battery meets the higher test criteria.

Figure 2:
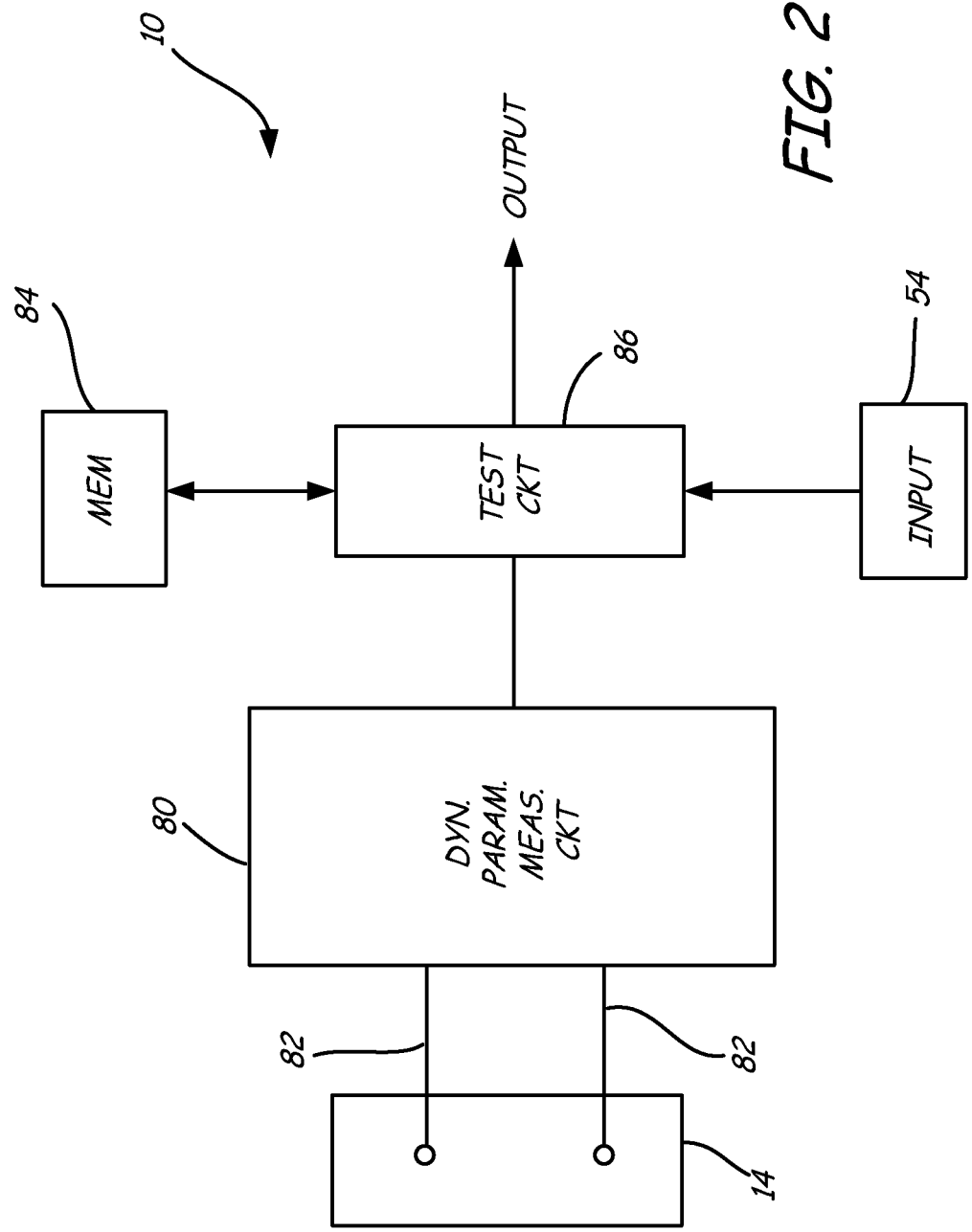
FIG. 2 is a simplified diagram illustrating a tester in accordance with the present invention.

FIG. 2 is a simplified block diagram of tester 10 in accordance with such an embodiment. In FIG. 2, tester 10 includes dynamic parameter measurement circuitry 80 which couples to battery 14 through Kelvin connections 82. Dynamic parameter measurement circuitry 80 can be any circuit configuration which measures a dynamic parameter of battery 14. As used herein, a dynamic parameter is one which is related to a signal having an AC component. The signal can be either applied directly or drawn from battery 14. Example dynamic parameters include dynamic resistance, conductance, impedance, admittance, etc. This list is not exhaustive, for example, a dynamic parameter can include a component value of an equivalent circuit of battery 14. Memory 84 is configured to store a plurality of different test criteria. For example, the test criteria can be a number of different thresholds or errors which are used to provide an indication as to whether the battery 14 is "good." Input 54, which can comprise a user input, is coupled to test circuitry 86. Test circuitry 86 applies a selected test criteria for memory 84 based upon user input 54 to the dynamic parameter measured by dynamic parameter measurement circuitry 80. Based upon this comparison, an output is provided. FIG. 2 is a very simplified block diagram and in actual practice a number of the individual elements can be implemented in a single microprocessor and other circuit configurations. Input 64 can be any type of input and is not limited to a user input.

In this aspect of the invention, the criteria used to test battery 14 can be adjusted based upon a particular aspect of battery 14. For example, if battery 14 is a new battery, a more stringent test can be applied to battery 14. Additionally, if battery 14 is intended to be used in an industrial vehicle or other situation which is very demanding of a battery, a more "difficult" or stringent test criteria can be provided. The test criteria can be based upon other factors to the dynamic parameter such as temperature or "static" parameters. The input from input 54 can be any type of input data and does not need to be user generated. Example input data includes every make, model, type, construction date, present date, temperature, vehicle type, VIN code, battery service requirements, requirements for a particular application, etc.

Tester 10 can test a battery which is formed by more than one individual battery. This is called a "battery pack". For example, some vehicles such as large industrial vehicles include multiple batteries which are connected in series, parallel or series-parallel. In such an embodiment, element 14 in FIGS. 1 and 2 can represent such a pack such batteries can be particularly difficult to test and, in many prior art battery testers, have required the batteries to be disconnected and individually tested. In accordance with one aspect of the present invention, microprocessor 30 tests the multiple batteries using a variety of appropriate techniques. Microprocessor 30 is capable of determining the configuration of the batteries (parallel, series or series-parallel) by measuring the voltage at the terminals of the "battery pack" and through receiving user input through input 54 indicating the number of batteries in the pack. Additionally, in some instances microprocessor 30 may also need to receive information related to the voltage of the individual batteries in the pack in order to make a determination as to the configuration of the pack. There are some instances where the configuration of the pack cannot be determined by simply knowing the voltage of individual batteries and taking measurements. A series of standard known configurations can be stored in the memory in tester 10 tester, and a user can select one such configuration. Configurations of battery packs include up to 12 batteries in parallel, three batteries in series and 12 batteries in series-parallel configurations. Microprocessor 30 is capable of determining the CCA rating and/or conductance of the entire battery pack using the information it has determined regarding the configuration of the battery pack. For example, in parallel configurations the CCA measurement is additive as is conductance, while in series-parallel or series configurations the voltage can be additive but the CCA/conductance can remain the same.

In one aspect, tester 10 is capable of detecting a good battery, a discharged battery, a bad cell, a bad battery, a marginal and/or defective wiring within a battery pack without disconnecting the pack. In one such embodiment, multiple test connections are used to connect to the battery pack. For example, one pair of connections can be used to connect to either end of the battery pack while another connection can be used to connect to points within the battery pack or to measure current flowing between points within the battery pack. Using this technique, the various currents flowing within the battery pack can be determined and this information can be used to detect a bad connection, such as a bad cable or poor physical connection between two points within the battery pack. Additionally, microprocessor 30 can instruct the user using display 32 to make various measurements at various points along the battery pack to more fully determine the condition of various portions of the battery pack.

In some instances, the microprocessor 30 can instruct the user to disconnect a certain battery within the battery pack in order to perform an isolated test on that battery.

In another aspect, microprocessor 30 uses advanced testing criteria or testing techniques such as fuzzy logic, neural networks or other artificial intelligence techniques to detect and make decisions regarding the health of a battery or a battery pack. Such techniques can also be used in evaluating time varying signals such as signals generated by the operation of alternator 16 or starter 20 in vehicle 12.

In another aspect, tester 10 includes a load such that a traditional load test can be performed on the battery 14. Such a load test is known in the art and is performed by applying a load to a battery and observing the effect of the applied load to the voltage or current flowing from the battery. In such an embodiment, such information can be used in conjunction with a resistance, impedance, conductance or admittance test of the battery 14 to identify a defect in the battery or otherwise determine the condition of the battery. This technique can also be used to measure the remaining or reserve capacity of the battery or battery pack. Such a testing technique provides additional information to microprocessor 30 which can then be used to make more advanced decisions regarding battery condition.

Microprocessor 30 can also compute, store, display or print out equivalent rating information regarding equivalent ratings of battery 14. Such equivalent ratings include CCA, SAE, DIN, IEC, EN, CA, MCA, JIS or others of the battery. In such an embodiment, microprocessor 30 can adjust for variations in the measured conductance of a battery pack due to cables between batteries in the pack or the connectors between the cables and the battery which can insert series resistances into the measurement. The adjustment can be based upon compensation data stored in a memory which is determined empirically by measuring different types of batteries or through other techniques. Particular compensation information can be determined through determining the configuration of batteries within a battery pack as described above. The compensation information can in the form of a multiplier which is used to multiply a conductance measurement.

In another aspect, measurements of battery conductance are used to "balance" the various batteries in a battery pack such that they are selected and arranged for delivering optimized current and/or receiving optimized charge current. This aspect is illustrated in FIG. 3. For example, if a 600 CCA battery is placed in series with a 500 CCA battery, one of the batteries will tend to become overcharged while the other battery will tend to be undercharged. Tester 10 can alert an operator regarding the unbalanced condition of the batteries within the pack. Tester 10 can prompt a user to disconnect certain batteries within the pack and perform individual tests on the batteries to determine which battery is unbalanced from the others. This will also assist in selecting the batteries used in the battery pack.

FIG. 3 illustrates a simplified diagram of this aspect of tester 10 and includes a dynamic parameter measurement circuit 80 coupled to battery 14 through connection 90. Battery 14 is illustrated as multiple batteries, in this case three separate batteries 14A, 14B and 14C. These batteries can be connected in series, parallel or series parallel. Connection 90 can be a single pair of Kelvin connectors which are selectively positioned between or on various batteries in pack 14. There can be more than two Kelvin connections which are coupled to pack 14. Memory 94 stores a first dynamic parameter from dynamic parameter measurement circuit 80 related to a dynamic parameter of at least one battery 14A, 14B or 14C within battery pack 14. Balance circuit 92 provides an in-balance output if a second dynamic parameter of a second battery or batteries within pack 14 is "substantially equal" to the dynamic parameter stored in memory 94. As used in this context, the term "substantially equal" means that the two dynamic parameters are within a predetermined or adjustable percentage or fixed amount from one another. If the two dynamic parameters are measured simultaneously, memory 94 is not required to store a dynamic parameter. In a further embodiment of this a aspect of the invention, a static parameter such as voltage is used in determining if the batteries are within balance. For example, the two batteries are within 0.1 volts of each other (i.e., 12.5 and 12.6 volts) and the conductance within 10%, an in-balance indication is provided. In another example, less than a 0.05 volt difference is required in addition to the dynamic parameter requirement. Additionally, data from multiple batteries can be stored in memory 94 and a preferred configuration of the batteries can be provided by balance circuitry 92 on its output. Information regarding the configuration of battery pack 14 can be received through the input 54 shown in FIGS. 1 and 2 and the output from balance circuit 92 adjusted accordingly.

The condition of cables or connectors can be determined by applying a large load, such as through an internal load in battery tester 10 or through application of a vehicle load 18, or through the application of a large resistance, for example more than about 0.1 ohms. An amp clamp measurement can also be used. Further, microprocessor 30 can prompt a user to measure voltage drops across various cables in the pack and make a decision (i.e., good/bad) regarding a cable or connection in the battery pack. Microprocessor 30 can store, display, print and manage multiple test results associated with the multiple test measurements made when measuring a number of batteries which make a battery pack. This can be partial measurement, parameter, or other items related to individual batteries within the pack.

In one aspect, battery tester 10 is configured to determine the CCA rating of a battery or battery pack having a relatively large CCA value, for example, up to 5000 CCA. In such an embodiment, sensitive amplifiers and/or relatively large current values can be used to obtain the CCA or conductance measurement. In another aspect, tester 10 can perform a test on vehicle 12 by instructing an operator to apply a load (i.e., head lights, blower, etc.) or a combination of loads and reserve the response from battery 14. This information can be used to determine diagnostic information regarding battery 14 out of the operation of components within vehicle 12.

With one aspect of the invention, the tester can be used to test the "straps" that are used to couple individual batteries together to form a battery pack. For example, a dynamic parameter can be measured with the Kelvin probes applied directly to the battery. A second dynamic parameter can be measured in which one of the straps separates a Kelvin probe from the battery. A microprocessor can then compute the dynamic parameter of the strap alone and provide an output if the strap is poor. For example, if the strap dynamic conductance is too low, a warning can be provided. This technique can be extended to test multiple straps. In addition to testing straps within the pack, this technique can also be used to test cables that connect to the battery. Dynamic parameters can be stored in the memory for use in subsequent computations, or multiple Kelvin probes can be used to simultaneously measure multiple dynamic parameters.

In some aspects, a separate current probe can be used, such as a shunt, amp clamp or Hall effect sensor, to measure the current flowing into or out of a battery or group of batteries under test. This data can be paired with voltage measurements to obtain static or dynamic parameters.

The tester can store measurements in memory such that the battery pack can be ranked in terms of performance.

Although the present invention has been described with reference to preferred embodiments, workers skilled in the art will recognize that changes may be made in form and detail without departing from the spirit and scope of the invention.

What is claimed is:

1. An electronic battery tester for use in testing a battery pack formed by a plurality of storage batteries, comprising: dynamic parameter measurement circuitry configured to measure dynamic parameters of batteries, wherein the dynamic parameters are related to an applied signal; a memory containing programming instructions; an output configured to provide instructions to an operator; and a microprocessor configured to operate in accordance with instructions stored in the memory and perform a battery test on a battery of the battery pack, the memory containing instructions which are performed by the microprocessor to thereby provide a message on the output which contains instructions to the operator to disconnect the battery from other batteries in the battery pack to thereby isolate the battery from other batteries in the battery pack, the microprocessor further configured to perform a battery test on the isolated battery, further including an electrical load, wherein the battery test is further a function of a load test.

2. An electronic battery tester for use in testing a battery pack formed by a plurality of storage batteries, comprising: dynamic measurement circuitry configured to measure a dynamic parameter of the battery pack, wherein the dynamic parameter is related to an applied signal; and a microprocessor which compensates the measured dynamic parameter of the battery pack based upon errors introduced into the dynamic parameter measurement of batteries in the battery pack due to cables which extend between batteries of the battery pack and electrically connect the batteries in the battery pack, and includes a memory configured to store compensation data for use in compensatory measurement errors.

3. The apparatus of claim 2 wherein the compensation is based on configuration of batteries in the battery pack.

4. The apparatus of claim 2 wherein the compensation comprises multiplier.

5. The apparatus of claim 2 wherein the dynamic parameter comprises conductance.

6. The apparatus of claim 3 wherein the compensation data is stored in a look-up table.

7. An electronic battery tester for use in testing a battery pack formed by a plurality of storage batteries, comprising: dynamic parameter measurement circuitry configured to measure a dynamic parameter of the battery pack and a dynamic parameter of a strap of the battery pack, wherein the dynamic parameter is related to an applied signal; and a microprocessor which determines battery condition based upon the measured dynamic parameter of the battery and the dynamic parameter of the strap of the battery pack and responsively provides an output indicative of a condition of the single strap, and includes a memory configured to store the measured dynamic parameter of the strap.

8. The apparatus of claim 7 wherein the microprocessor determines condition of the strap based upon the dynamic parameter of the strap.

9. The apparatus of claim 7 wherein the dynamic parameter of the strap comprises dynamic conductance.

* * * * *